(12) United States Patent
Ju et al.

(10) Patent No.: US 7,453,720 B2
(45) Date of Patent: Nov. 18, 2008

(54) MAGNETIC RANDOM ACCESS MEMORY WITH STACKED TOGGLE MEMORY CELLS HAVING OPPOSITELY-DIRECTED EASY-AXIS BIASING

(75) Inventors: Kochan Ju, Monte Sereno, CA (US); Jei-Wei Chang, Cupertino, CA (US)

(73) Assignee: Maglabs, Inc., San Jose, CA (US)

( * ) Notice: Subject to any disclaimer, the term of this patent is extended or adjusted under 35 U.S.C. 154(b) by 257 days.

(21) Appl. No.: 11/138,609

(22) Filed: May 26, 2005

(65) Prior Publication Data
US 2006/0267056 A1    Nov. 30, 2006

(51) Int. Cl.
*G11C 11/02* (2006.01)
(52) U.S. Cl. ...................................... 365/158
(58) Field of Classification Search .................. 365/173, 365/158, 171; 257/295, 421
See application file for complete search history.

(56) References Cited

U.S. PATENT DOCUMENTS

| | | | |
|---|---|---|---|
| 5,408,377 A | 4/1995 | Gurney et al. | |
| 5,966,012 A | 10/1999 | Parkin | |
| 6,545,906 B1 | 4/2003 | Savtchenko et al. | |
| 6,590,806 B1* | 7/2003 | Bhattacharyya | 365/173 |
| 6,633,498 B1 | 10/2003 | Engel et al. | |
| 7,109,539 B2* | 9/2006 | Lu | 257/295 |
| 2002/0036331 A1 | 3/2002 | Nickel et al. | |
| 2003/0209769 A1* | 11/2003 | Nickel et al. | 257/421 |
| 2004/0012994 A1 | 1/2004 | Slaughter et al. | |
| 2004/0125649 A1 | 7/2004 | Durlam et al. | |
| 2004/0264238 A1 | 12/2004 | Akerman et al. | |
| 2005/0047198 A1 | 3/2005 | Engel et al. | |
| 2005/0167657 A1* | 8/2005 | Nickel et al. | 257/30 |
| 2006/0154381 A1* | 7/2006 | Gaidis et al. | 438/3 |

OTHER PUBLICATIONS

Reohr et al., "Memories of Tomorrow", IEEE Circuits & Devices Magazine, Sep. 2002, pp. 17-27.
Durlam et al., "A 0.18-m 4Mb Toggling MRAM", IEDM Technical Digest 2003, Session 34, paper #6.
Pugh et al, IBM J. of Res & Develop, vol. 4, No. 2, 163.

* cited by examiner

*Primary Examiner*—Richard Elms
*Assistant Examiner*—Douglas King

(57) ABSTRACT

A "toggling" type of magnetic random access memory (MRAM) has memory stacks arranged in the X-Y plane on the MRAM substrate with each memory stack having a plurality of toggle memory cells stacked along the Z axis. Each stack is located at an intersection region between the two orthogonal write lines. The cells are stacked in pairs, with the cells in each pair having their easy axes of magnetization aligned substantially parallel to one another and nonparallel with the X and Y axes. The cells in each pair have their free layers magnetically biased in opposite directions. Because the free layer of each cell in a pair is biased in a direction opposite to the bias direction of the free layer of the other cell, one cell in a pair can be toggle written without toggle writing the other cell in the pair. The bias fields on the free layers reduces the required switching field for each cell, which results in less write current and a lower-power toggling MRAM.

26 Claims, 11 Drawing Sheets

Simple Ferromagnet

Synthetic Antiferromagnet (SAF)

MAGNETIC RANDOM ACCESS MEMORY WITH STACKED TOGGLE MEMORY CELLS HAVING OPPOSITELY-DIRECTED EASY-AXIS BIASING

BACKGROUND OF THE INVENTION

1. Field of the Invention

This invention relates generally to magnetic random access memory (MRAM) and more particularly to MRAM with "toggle" memory cells.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS & DEVICES MAGAZINE*, September 2002, pp. 17-27. In these devices the MTJs are arranged as an array in a single layer (the X-Y plane) on a semiconductor substrate. In one type of architecture, called a 1T1MTJ MRAM (one transistor and one MTJ), each MTJ is located between a bit line and a transistor, with the word lines located beneath the MTJs. In another type of architecture, called a cross-point (XPC) MRAM, the MTJs are located directly between the bit and word lines.

In both MRAM architectures, a selected MTJ cell is programmed or "written", i.e., its magnetic state or +/−X magnetization direction is switched, by write currents passing in X and Y directions through the bit and word lines located above and below the selected MTJ. The write currents generate orthogonal magnetic fields in the X and Y directions that switch the magnetization direction of the selected MTJ. The typical writing scheme is a "half-select" scheme, where each of the bit and word lines generates half the required write field for switching the selected MTJ cell. However, the energized word and bit lines reduce the magnetic reversal energy barrier in the other cells along their respective word and bit lines. This makes these "half-selected" cells more susceptible to having their magnetic states switched when the selected cell is written.

An MRAM with a MTJ cell structure and switching mechanism that does not suffer from the half-select problem of the conventional MRAM has been proposed by Motorola. This "Savtchenko" cell structure and switching mechanism, named for its late inventor, is described in U.S. Pat. No. 6,545,906 B1 and M. Durlam et al., "A 0.18 μm 4 Mb Toggling MRAM", *IEDM Technical Digest* 2003, Session 34, paper #6. In this type of MRAM, the MTJ cell's ferromagnetic free layer is a synthetic antiferromagnet (SAF), i.e., a multilayer of two ferromagnetic sublayers of nearly identical magnetic moment, separated by an antiferromagnetic coupling layer that maintains an antiparallel alignment of the moments of the two sublayers. An SAF free layer in a spin-valve magnetoresistive sensor is described in U.S. Pat. No. 5,408,377, and an MTJ memory cell with SAF free and pinned layers is described in U.S. Pat. No. 5,966,012. The Savtchenko type of MRAM uses two orthogonal writing or programming lines, but with the MTJ cell's axis aligned 45 degrees to each of the lines. The SAF free layer responds to applied magnetic fields differently than a conventional single ferromagnetic free layer. Writing occurs by a process called "toggle" writing in which a two-phase programming pulse sequence incrementally rotates the SAF free layer moment or magnetization direction 180 degrees, so the MRAM is sometimes called a "toggling" MRAM and the memory cell a "toggle" cell. Because of the cell's 45 degree angle to the programming lines and its field response, the field from a single programming line cannot switch the magnetization of a half-selected cell, which results in an MRAM with enhanced cell selectivity.

A toggling MRAM with two toggle memory cells located between the write lines to produce more than two magnetic states, and thus more than two logic states, has been proposed in US20050047198A1. In this device the two cells have different switching fields and the net moments of the pinned layers of the two cells are parallel. Writing occurs by application of two levels of write current in the same X-Y quadrant, with the lower write current toggle writing just one cell and the higher write current toggle writing both cells simultaneously.

What is needed is a toggling MRAM that has multiple toggle memory cells stacked vertically, i.e., in the Z direction from the substrate, but that requires lower switching fields and thus lower power.

SUMMARY OF THE INVENTION

The invention is a toggling MRAM with memory stacks arranged in the X-Y plane on the MRAM substrate with each memory stack having a plurality of toggle memory cells stacked along the Z axis. Each stack is located at an intersection region between the two orthogonal write lines. The cells are stacked in pairs, with the cells in each pair having their easy axes of magnetization aligned substantially parallel to one another and nonparallel with the X and Y axes. The cells in each pair have their free layers biased in opposite directions. In one embodiment the biasing field is applied by the free layer's associated pinned layer, and in another embodiment by hard magnets located outside the stack. Because the free layer of each cell in a pair is biased in a direction opposite to the bias direction of the free layer of the other cell, one cell in a pair can be toggle written without toggle writing the other cell in the pair. Each cell in a pair is magnetically separated from the other cell in its pair by a nonmagnetic separation layer, and stacked pairs are also magnetically separated from one another by nonmagnetic separation layers. If there are N pairs in a stack (where N is 2 or more), the substantially parallel easy axes of magnetization of the free layers in the N pairs are generally equally angularly spaced about an axis parallel to the Z axis. Any cell in the stack can be toggle written without toggle writing any of the other cells in the stack. The bias field reduces the write field required to toggle switch a cell, thus resulting in a toggling MRAM with lower power consumption.

For a fuller understanding of the nature and advantages of the present invention, reference should be made to the following detailed description taken together with the accompanying figures.

DETAILED DESCRIPTION OF THE INVENTION

Prior Art

Figure 1:
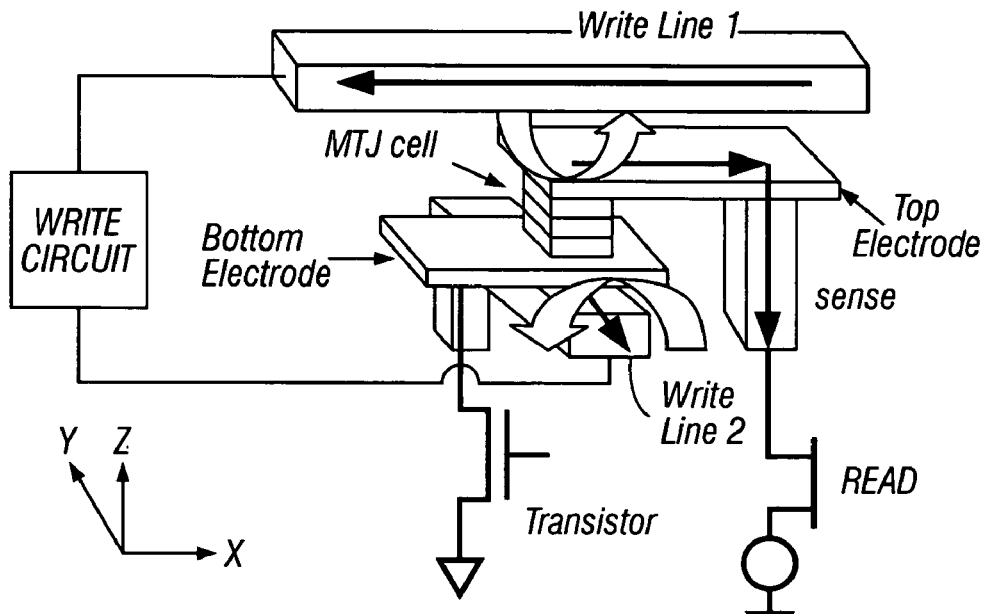
FIG. 1 is a perspective view of a portion of the prior art MRAM showing a single Savtchenko MTJ memory cell and associated write and read circuitry.

FIG. 1 is a perspective view of a portion of the prior art MRAM showing a single Savtchenko MTJ memory cell with a SAF free layer whose magnetization direction is switched by toggle writing. The MTJ cell is located in an intersection region between a second write line (WL2) (aligned along the Y axis) and a first write line (WL1) (aligned along the X axis). The write lines are connected to a write circuit that provides the sequence of current pulses to perform the toggle writing. Only one MTJ cell and intersection region is depicted in FIG. 1, but in the MRAM there are a plurality of generally parallel second write lines and a plurality of generally parallel first write lines that are orthogonal to the second write lines and overlap to define a plurality of intersection regions. Each intersection region contains an MTJ cell. Each MTJ cell is electrically connected to a transistor that is formed on the MRAM substrate (not shown). In the embodiment of FIG. 1 each MTJ cell is electrically connected to top and bottom electrodes that provide connection to the transistor and the resistance detection or read circuit. The magnetic state of the MTJ cell is read, i.e., the direction of the SAF free layer magnetization relative to direction of the pinned layer magnetization is detected, by turning on the transistor and measuring the resistance with the read circuit when a sense current Is flows through the MTJ cell.

Figure 2:
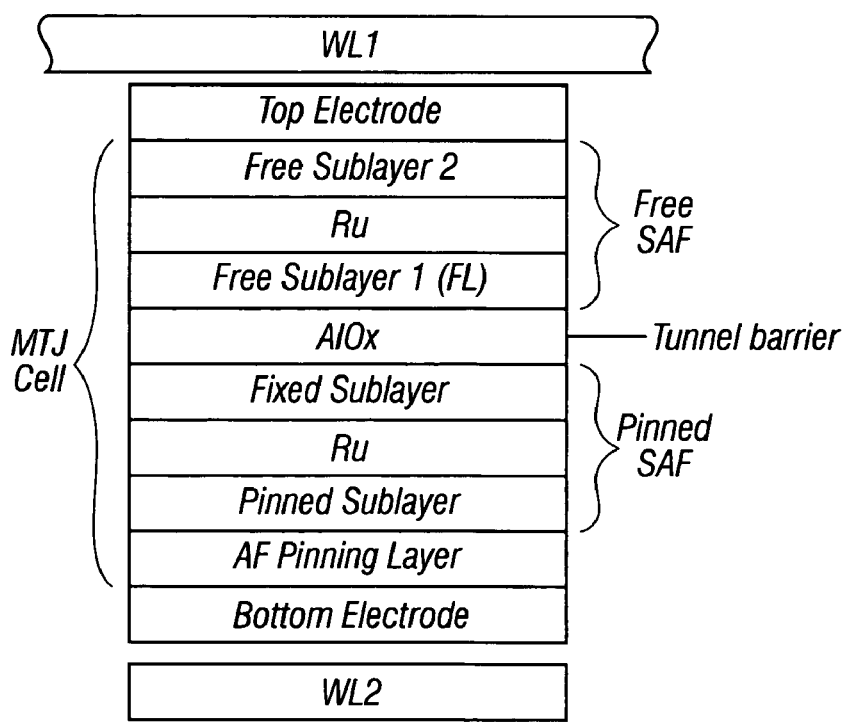
FIG. 2 is a sectional schematic showing the layers making up the prior art MTJ memory cell of FIG. 1.

FIG. 2 is a sectional schematic showing the layers making up the MTJ cell. An SAF free layer and an SAF pinned layer are separated by a tunnel barrier, which is typically formed of alumina ($Al_2O_3$). The SAF pinned layer is a trilayer of a pinned ferromagnetic sublayer and a fixed ferromagnetic sublayer spaced apart by an antiferromagnetic coupling (AFC) layer, which is typically ruthenium (Ru). The magnetic moments of the pinned and fixed sublayers are nearly equal but antiparallel so that the resultant net magnetic moment of the SAF pinned layer is nearly zero. The pinned sublayer of the SAF pinned layer is pinned by being antiferromagnetically coupled to an antiferromagnetic (AF) pinning layer, which is typically a Mn alloy, such as FeMn or PtMn. The pinned layer in the MTJ cell is preferably a SAF pinned layer but may be a conventional single ferromagnetic layer pinned to the AF pinning layer. The SAF free layer is a trilayer of first and second ferromagnetic sublayers spaced apart by an AFC coupling layer, which is typically ruthenium (Ru), with the magnetic moments of the two ferromagnetic sublayers being nearly balanced.

Figure 3A:
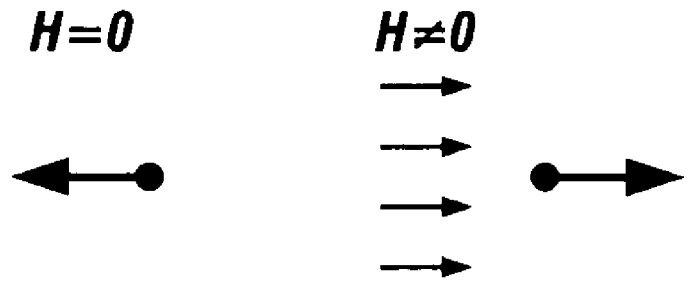
FIGS. 3A and 3B show a comparison of the magnetic field responses of a simple ferromagnet and a synthetic antiferromagnet (SAF), respectively.
Figure 3B:
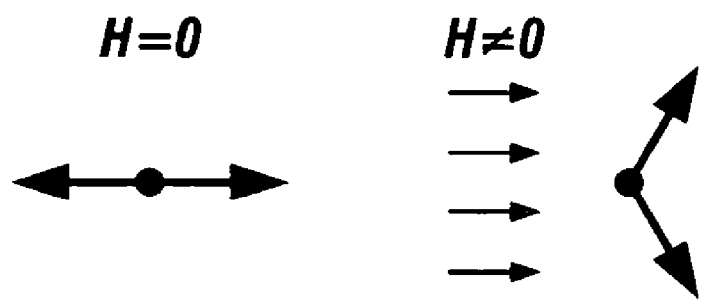

As shown in FIGS. 3A and 3B, the magnetic field response of an SAF is very different from that of a simple ferromagnet. The simple ferromagnet aligns with its magnetization direction, i.e., its magnetic moment, parallel to the applied field H, as shown in FIG. 3A. The nearly-balanced SAF, however, reaches the lowest energy by the spin-flop phenomenon which orients both moments of the two sublayers nearly perpendicularly to the applied field H, with a slight canting toward the applied field direction, as shown in FIG. 3B. The spin-flop phenomenon lowers the total magnetic energy in an applied field by rotating the magnetic moments of the two ferromagnetic sublayers so that they are nominally orthogonal to the applied field direction but still predominantly antiparallel to one another. The rotation, or flop, combined with a small deflection of each ferromagnetic magnetic moment in the direction of the applied field, accounts for the decrease in total magnetic energy.

Figure 4:
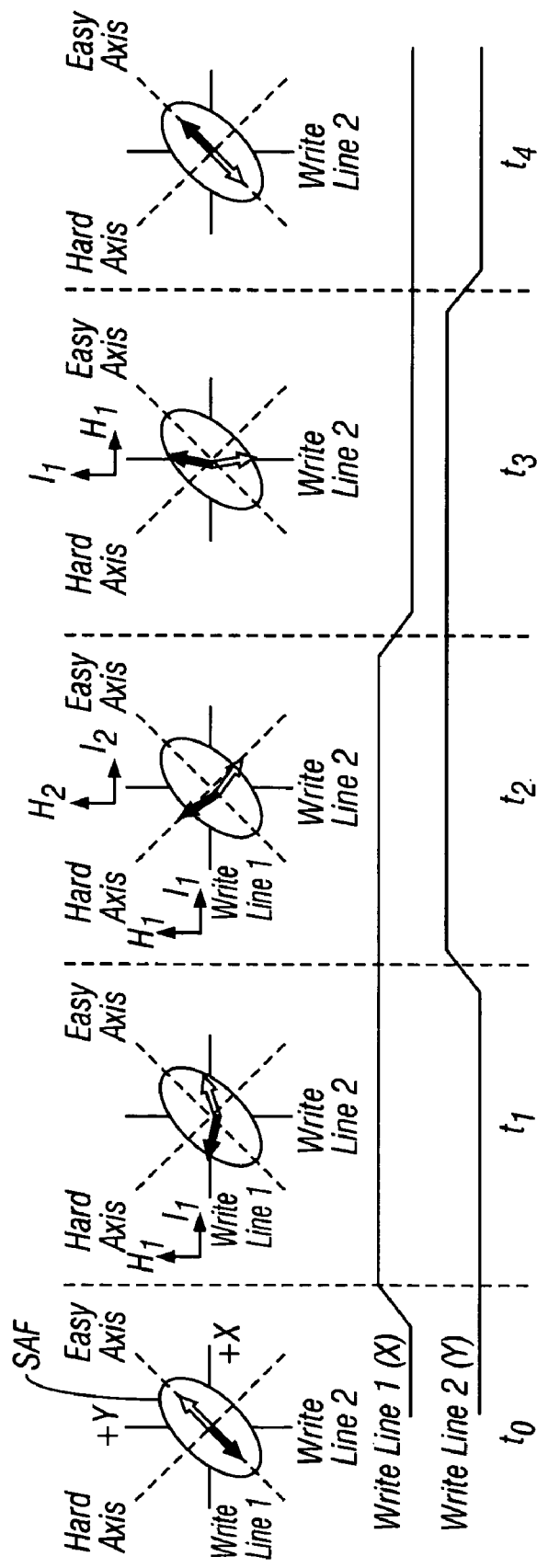
FIG. 4 illustrates the toggle write scheme for the prior art MTJ memory cell with a SAF free layer.

FIG. 4 illustrates the toggle write scheme for the MTJ cell with the SAF free layer. The SAF free layer has uniaxial magnetic anisotropy with its easy axis of magnetization oriented at 45 degrees from each of the two write lines. The SAF pinned layer is pinned with its magnetization direction aligned with the easy axis of the SAF free layer. The two stable magnetic states in the absence of an applied field are with the magnetization direction of the SAF free layer (shown by the solid arrow) either parallel or antiparallel to the magnetization direction of the SAF pinned layer, resulting in either a low or a high resistance, respectively.

As shown in FIG. 4, at time $t_1$ a positive current $I_1$ in the +X direction on WL1 generates an applied field $H_1$ in the +Y direction, causing the moments of both sublayers to rotate clockwise approximately 45 degrees. At time $t_2$ a positive current $I_2$ in the +Y direction on WL2 generates an applied field $H_2$ in the +X direction, which together with $H_1$ results in a net applied field at 45 degrees between the +X and +Y directions, causing the moments of both sublayers to rotate clockwise approximately another 45 degrees. At time $t_3$ the positive current $I_1$ is shut off, which results in just the field $H_2$ being applied in the +X direction, causing the moments of both sublayers to rotate clockwise approximately another 45 degrees. At this point, the moments of both sublayers have generally been rotated past their hard-axis instability points. At time $t_4$ the positive current $I_2$ is also shut off, which results in no fields being applied, causing the moments of both sublayers to rotate clockwise approximately another 45 degrees to the stable state aligned with the easy axis, but now rotated 180 degrees from the initial state. Thus, by sequentially switching the WL1 and WL2 currents on and off, the moments of the two sublayers are toggled in approximately 45 degree increments until the magnetization direction of the SAF free layer has been rotated 180 degrees. The toggle switching can also be achieved with a +X field applied at times $t_1$ and $t_2$ and a +Y field at times $t_2$ and $t_3$.

As shown in FIG. 4, if both currents are on, then the moments of the sublayers will align generally orthogonal to a 45 degree angle to the write lines, which is along the hard axis of magnetization. However, when only one current is on, the magnetic field will cause the moments of the sublayers to align generally parallel to a write line. In this toggle writing scheme only a single applied field along either the X or Y axis is present at half-selected cells. This single field is insufficient to switch the moments of the sublayers of the SAF free layers in the half-selected cells beyond their hard-axis instability points, so the magnetic states of the half-selected cells cannot be inadvertently switched when toggle writing to a selected cell.

The Invention

The invention is an MRAM similar to the above-described prior art MRAM, but with a multibit memory stack of toggle memory cells in each intersection region, a toggle writing scheme for selectively writing a selected cell in the stack with reduced write current, and a read scheme for the multiple memory cells. The cells are stacked in pairs, with the MRAM having at least a single pair in each intersection region. The SAF free layers in each pair have their easy axes of magnetization aligned parallel and are biased in opposite directions along their easy axes. Biasing of the SAF free layer in a single toggle memory cell is described in U.S. Pat. No. 6,633,498 B1.

Figure 5:
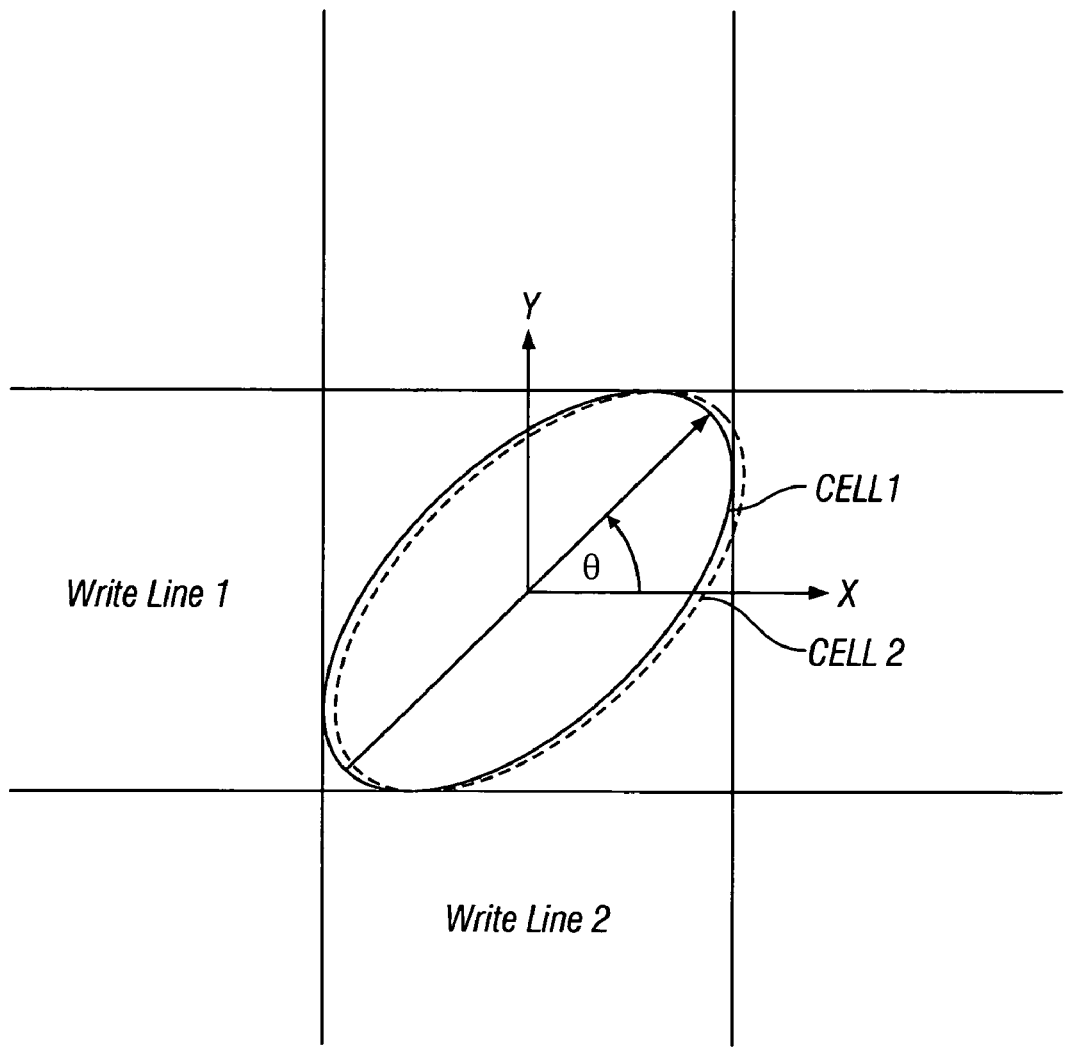
FIG. 5 is a top view of a multibit memory stack according to this invention having a pair of two MTJ cells showing the orientation of their parallel easy axes of magnetization relative to the write lines.

The invention will be described first for an MRAM with a single pair of two stacked memory cells in each intersection region. FIG. 5 is a top view of a multibit memory stack in an intersection region and having a pair of two MTJ cells 1 and 2, with cell 1 depicted on top of cell 2. Cell 2 is located directly beneath cell 1 and is shown in dotted outline slightly shifted from cell 1 only for illustration purposes. Each cell is depicted as having a generally elliptical shape, which is meant to represent that the cell's SAF free layer has shape anisotropy with the long axis being the easy axis and the short axis (the axis perpendicular to the long axis) being the hard-axis. The angle θ is approximately 45 degrees so the easy axes of magnetization of the two cells are oriented at the 45 degree angle between the X and Y axes corresponding to the write lines WL1, WL2, respectively. Numerous other shapes besides the elliptical shape are possible to provide uniaxial anisotropy induced by the shape of the cell.

Figure 6:
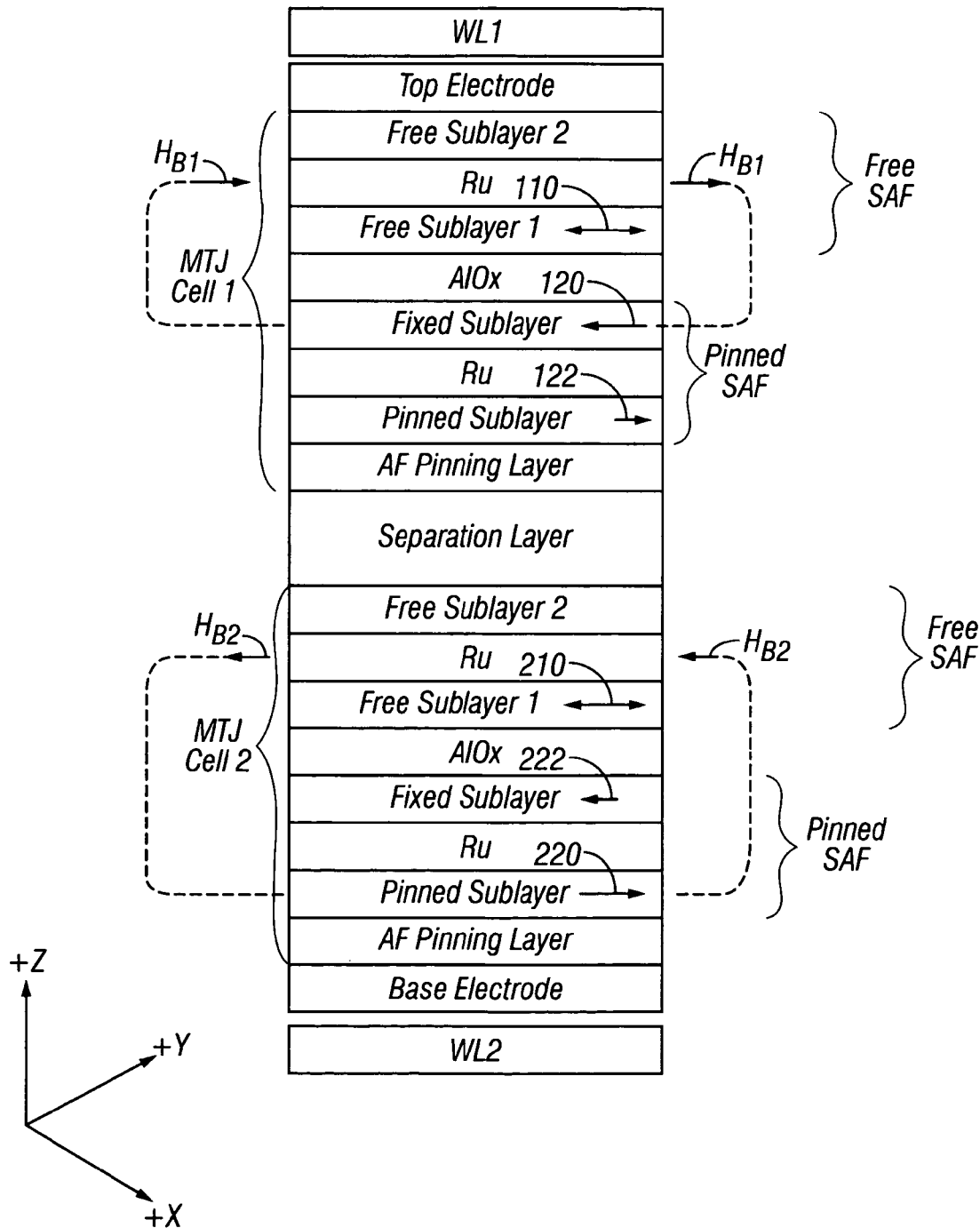
FIG. 6 is a sectional view taken through the long axes of the cells showing the layers making up the two MTJ cells in the multibit memory stack according to this invention with the easy axes of the two cells biased in opposite directions.

FIG. 6 is a schematic sectional view taken through the long axes of the cells showing the layers making up the two MTJ cells in the pair. Each cell is substantially as described with respect to FIG. 2, but cell 1 is stacked on top of cell 2 with a nonmagnetic separation layer between the two cells, and each SAF pinned layer is not a nearly-balanced SAF, but an SAF with a net magnetic moment. Because in each SAF pinned layer the moment of the fixed sublayer is not compensated by a nearly-equal moment from the pinned sublayer, each SAF pinned layer is an "uncompensated" SAF pinned layer.

A relatively wide range of materials and thicknesses are known for use in MTJ memory cells, but representative examples are 1-4 nm of CoFe or CoFe/NiFe bilayers for the ferromagnetic sublayers in each SAF layer, 0.6 to 3 nm Ru for the antiferromagnetic coupling layer in each SAF layer, 5 to 15 nm IrMn for the AF pinning layer, and 0.5-3.0 nm alumina ($Al_2O_3$) for the tunnel barrier. While not depicted in FIG. 6, seed layers may be located beneath the AF pinning layers and a capping layer may be located beneath the top electrode. The nonmagnetic separation layer can be a material such as Cu or NiCu with a thickness of approximately 1 to 300 nm. The nonmagnetic separation layer provides electrical connection between the two cells while separating the SAF free layer of cell 2 from the AF pinning layer of cell 1.

The SAF free layer of cell 1 has a net magnetic moment 110 or magnetization direction that can have one of two antiparallel directions (−1, −1) or (1, 1), corresponding to the directions 45 degrees to the −X, −Y and +X, +Y axes, respectively. In this example, the uncompensated SAF pinned layer of cell 1 has a net magnetic moment that is oriented in the (−1, −1) direction because it's fixed sublayer is thicker and thus has a higher moment 120 than the moment 122 of its pinned sublayer. This results in the fixed sublayer of cell 1 being magnetostatically coupled with the first free sublayer of cell 1, as depicted by the dashed lines. The moment from the fixed sublayer in cell 1 thus generates an effective bias field $H_{B1}$ that acts on the SAF free layer of cell 1 in the (1, 1) direction.

Similarly, the SAF free layer of cell 2 has a net magnetic moment 210 that can have one of two antiparallel directions (−1, −1) or (1, 1). In this example, the uncompensated SAF pinned layer of cell 2 has a net magnetic moment that is oriented in the (1, 1) direction because its pinned sublayer is thicker and thus has a higher moment 220 than the moment 222 of its fixed sublayer. This results in the pinned sublayer of cell 2 being magnetostatically coupled with the first free sublayer of cell 2, as depicted by the dashed lines. The moment from the pinned sublayer in cell 2 thus generates an effective bias field $H_{B2}$ that acts on the SAF free layer of cell in the (−1, −1) direction. In this example $H_{B1}$ and $H_{B2}$ are selected to be equal. Thus each of the SAF free layers of the two cells in the pair is easy-axis biased by a bias field $H_B$, but in opposite directions. The value of $H_B$ can be chosen by selection of the appropriate thicknesses and/or material compositions of the ferromagnetic fixed and pinned sublayers in each SAF pinned layer.

Uniaxial magnetic anisotropy of a ferromagnetic layer means essentially that all of the magnetic domains tend to align along the same axis, referred to as the easy axis, which is the lowest energy state. The anisotropy field $H_k$ of a ferromagnetic layer with uniaxial magnetic anisotropy is the magnetic field that would need to be applied along the easy axis to switch the magnetization direction. The minimum write field for switching an SAF free layer without any bias field is $H_{SW}$ and is given by $$H_{SW}=[2H_k*(2A/M_S)]^{1/2},$$

where, A is the surface interlayer antiferromagnetic exchange constant, and $M_S$ is the magnetization of each of the two compensating sublayers.

Figure 7:
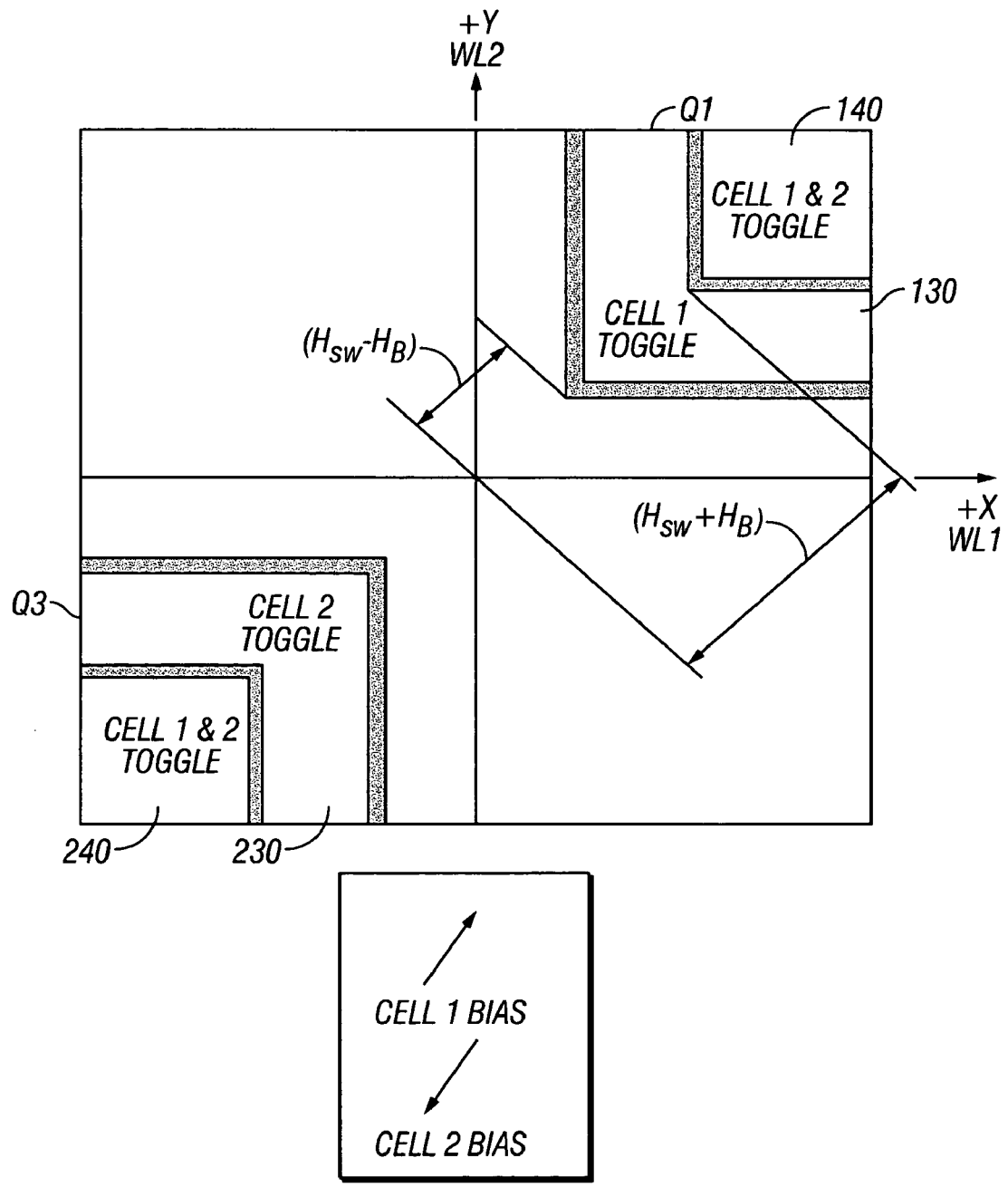
FIG. 7 shows the corresponding write current window for the pair of toggle memory cells with opposite easy-axis-biasing depicted in FIGS. 5 and 6.

FIG. 7 shows the corresponding write current window for the pair of toggle memory cells. For a write field $H_w$, such that $(H_{SW}-H_B)<H_w<(H_{SW}+H_B)$, a selective toggle write window exists in the first quadrant Q1, where $H_{SW}$ is the switching field of cell 1 and cell 2 without any biasing. The switching threshold of cell 1 in Q1 is reduced to $H_{SW}-H_B$, while the switching threshold of cell 1 in the third quadrant Q3 is increased to $H_{SW}+H_B$. Similarly, the switching threshold of cell 2 in Q3 is reduced to $H_{SW}-H_B$, while the switching threshold of cell 2 in Q1 is increased to $H_{SW}+H_B$. Thus, write currents $+I_{WL1}$ and $+I_{WL2}$, of sufficient magnitude to generate $H_W$ in the region 136 and applied according to the toggle-write pulse sequence as described in FIG. 4, will toggle-write cell 1 but not cell 2. For the same write field $H_W$, a selective toggle-write window exists in the third quadrant Q3. Thus, write currents $-I_{WL1}$ and $-I_{WL2}$, of sufficient magnitude to generate $H_W$ in the region 230 and applied according to the toggle-write pulse sequence as described for FIG. 4, will toggle-write cell 2 but not cell 1.

Region 140 in Q1 represents the region of write fields where both cell 1 and cell 2 would be toggle written if the write currents $+I_{WL1}$ and $+I_{WL2}$ were high enough to generate a write field greater than $(H_{SW}+H_B)$. Region 240 in Q3 represents the region of write fields where both cell 1 and cell 2 would be toggle written if the write currents $-I_{WL1}$ and $-I_{WL2}$ were high enough to generate a write field greater than ($H_{SW}$+ $H_B$).

Since the effect of the bias field $H_B$, acting on the compensated SAF free layer, is like a perpendicular anisotropy field and yet the magnitude is smaller than the $H_k$, the quiescent magnetization remains parallel to the $H_k$ direction as long as $H_B<H_{SW}$. So the $\Delta R$ of the MTJ is not affected by the easy-axis biasing.

The fabrication of the multibit memory stack of FIG. 6 begins with the MRAM wafer having WL2 and the base electrode already formed on it. A suitable seed layer is deposited on the base electrode layer, followed by deposition of the AF pinning layer, the pinned sublayer, the Ru AFC layer and the fixed sublayer of the SAF pinned layer of cell 2. The tunnel barrier of MTJ cell 2 is then formed by deposition of an aluminum film, followed by oxidation to form the alumina tunnel barrier. The first free sublayer, the Ru AFC layer and the second free sublayer of the SAF free layer of cell 2 are then deposited on the tunnel barrier, followed by the nonmagnetic separation layer. The process for fabricating MTJ cell 1 on top of the separation layer is essentially the same as for MTJ cell 2. All of the layers are deposited in the presence of a magnetic field aligned with the easy axes of cells 1 and 2. This defines the overall magnetization directions of both cells, including the magnetization directions of the AF pinning layers of both cells. In the example depicted in FIG. 6, the field applied during deposition of all the layers is in the (1, 1) direction. This results in the magnetization directions of the pinned sublayers of the pinned SAF layers in both cells being parallel. However, because in cell 1 the fixed sublayer is thicker than the pinned sublayer, while in cell 2 the pinned sublayer is thicker than the fixed sublayer, the net magnetic moment of the two SAF pinned layers will be in opposite directions, as represented by arrows 120, 220. The wafer is then annealed without the presence of a magnetic field at temperatures around 200 to 300° C. to improve the temperature dependence of the exchange coupling. Next the wafer is lithographically patterned and etched to define the shape of the cells, thereby forming their uniaxial shape anisotropy. After the patterning, etching and resist removal, an insulating material, such as alumina, is used to refill the areas removed by etching. The process described above results in MTJ cells with the SAF pinned layers located below the tunnel barrier, but one or both of the MTJ cells in the stack can be formed with the SAF free layers located below the tunnel barrier.

An alternative fabrication process for the multibit memory stack does not rely on shape anisotropy of the cells. It is known that uniaxial anisotropy of the ferromagnetic free layer can be defined with the applied magnetic field during the deposition. The magnitude of the anisotropy can be quite high in certain materials such as CoFeB and CoFeHf. Also, it has been reported by Pugh et al, *IBM Journal of Research & Development*, Vol. 4, No. 2, p. 163 (1960), that high uniaxial anisotropy can be obtained in NiFe by controlling the angular incident angle in an ion beam deposition or evaporator system. By orienting the wafer relative to the magnetic field direction and/or the incident beam angle, the anisotropy angle can be defined by deposition rather than by lithographic patterning. If the uniaxial anisotropy of the cells is defined by a material deposition scheme, such as angular incidence, the cells can have the same shape and matching perimeters that are aligned in the Z-direction. One example would be circular-shaped cells. A circular geometry allows the cells to be packed closer together in the X-Y plane.

While in FIG. 6 each cell has an uncompensated SAF pinned layer, the pinned layer could be a conventional single layer of ferromagnetic material exchange-coupled to an AF pinning layer. The magnetic moment from the single-layer pinned layer would then provide the bias field $H_B$. However, in this case the magnetization direction of the AF pinning layer needs to be set in the opposite direction for cell 1. In other words, the applied field during deposition of the layers making up cell 1 need to be in the (−1, −1) direction.

Figure 8:
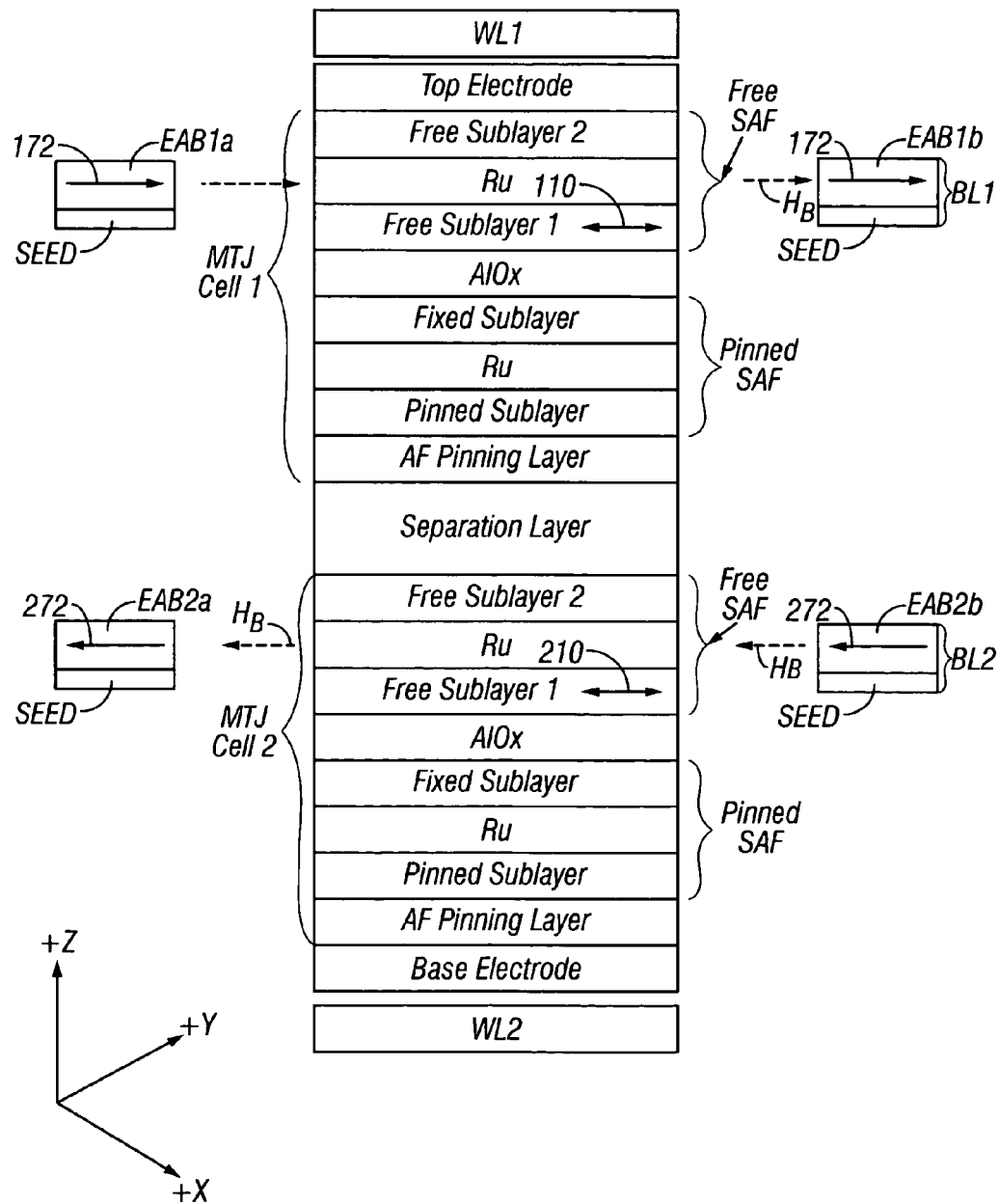
FIG. 8 is a sectional view taken through the long axes of the cells showing the layers making up the two MTJ cells in an embodiment of the multibit memory stack according to this invention with hard magnet biasing layers located outside the stack to bias the easy axes of the two cells in opposite directions.

FIG. 8 shows an embodiment of the memory unit that uses biasing layers of hard magnets located outside the stack to bias the easy axes of the two cells in opposite directions. In this structure each SAF pinned layer is a nearly-balanced pinned layer so that its net magnetic moment is near zero and it generates no bias field. The biasing layer BL2 associated with the SAF free layer in cell 2 comprises two segments located on opposite sides of the stack, each segment being generally coplanar with free sublayer 1 in cell 2 and being formed of easy-axis bias (EAB) material formed on a suitable seed layer. EAB2a and EAB2b in the two BL2 segments have magnetization directions 272 directed in the (−1,−1) direction parallel to the easy axis of free sublayer 1 in cell 2 to generate an easy-axis biasing field $H_B$ in the (−1,−1) direction. Similarly, the biasing layer BL1 associated with the SAF free layer in cell 1 comprises two segments located on opposite sides of the stack, each segment being generally coplanar with free sublayer 1 in cell 1 and being formed of EAB material formed on a suitable seed layer. EAB1a and EAB1b in the two BL1 segments have magnetization directions 172 directed in the (1,1) direction parallel to the easy axis of free sublayer 1 in cell 1 to generate an easy-axis biasing field $H_B$ in the (1,1) direction. Thus each of the SAF free layers of the two cells in the pair is easy-axis biased by a bias field $H_B$, but in opposite directions.

For the structure shown in FIG. 8, the layers making up the memory cells are formed and then patterned by etching to form the stack. After etching, an insulating dielectric, such as alumina, is refilled on the substrate, and then a seed layer material, such as Cr or TiW, and a permanent magnetic material, such as CoPtCr are patterned to form the two segments BL2. More insulation dielectric is refilled over BL2 and materials for a second seed layer and permanent magnet are deposited and patterned to form BL1. The two permanent magnets in BL2 and BL1 have different coercivities, Hc-high and Hc-low, to allow the magnetization directions 272, 172 to be set in opposite directions. A first applied magnetic field greater than Hc-high is used to set the high coercivity permanent magnet in the desired direction. A second magnetic field greater than Hc-low but less than Hc-high is applied in the opposite direction to set the low coercivity permanent magnetic in the desired direction. The strength of the biasing field $H_B$ from the EAB1 and EAB2 permanent magnets is selected by appropriate choice of the composition and/or thickness of the permanent magnets. In the embodiment shown in FIG. 8 each biasing layer BL1, BL2 includes EAB segments formed of a hard (relatively high coercivity) or permanent ferromagnet, such as a ferromagnet made of a CoPt alloy, like a CoPtCr alloy. However, one of more of BL1 and BL2 can have its EAB segments formed of a ferromagnetic layer pinned by being exchange coupled to an AF pinning layer.

In the embodiment of FIG. 6 and the outside-the-stack embodiment of FIG. 8, the SAF free layers are located above the SAF pinned layers in both cells 1 and 2. However, in one or both cells the pinned layer can be located above the free layer. Referring to FIG. 6, in cell 1 the SAF pinned layer may be located above the SAF free layer. This structure would place the two SAF pinned layers farther apart from each other to assure that each SAF pinned layer provides magnetostatic coupling only to its associated SAF free layer.

FIGS. 6 and 8 depict the write lines directly above and below the cells and aligned with the X and Y axes. However, each write line can be a pair of write lines spaced on the sides of the stack, near the top and bottom of the stack, with the memory cells located in the intersection region between the top and bottom pairs of write lines. Thus write line 2 can be a pair of write lines spaced on the sides of the base electrode (FIGS. 6 and 8) and aligned parallel to the Y axis and write line 1 can be a pair of write lines spaced on the sides of the top electrode and aligned parallel to the X axis. Write current directed along both lines in a pair will generate a magnetic field substantially in the planes of the free layers in the stack.

Each MTJ cell in the pair can be a "1" or a "0", so there are four possible magnetic states for the pair. These states are represented by (cell 1 state, cell 2 state) as (1,1), (1,0), (0,1) and (0,0). If the two cells have the same resistance difference, $\Delta R$, between the "1" and "0" states, a conventional comparator can only detect 3 resistance levels instead of the 4 needed. However, by fabricating cell 1 and cell 2 with different MTJ materials so that the cells have different $\Delta R$ values, four distinguishable resistance levels can be detected. For example, if $\Delta R$ of cell 1 is at least twice the $\Delta R$ of cell 2 the four states can be determined from the four net resistance levels, with the highest resistance being (1,1) followed by (1,0), (0,1) and (0,0). Published patent application US20020036331A1 describes an MRAM with a memory cell of two stacked conventional MTJ cells in which the ferromagnetic layers in the cells have different sizes so that the cells have different $\Delta R$ values. The logic state of this two-bit memory cell is read by applying a voltage across the memory cell and determining the magnitude of a sense current that flows through the memory cell, with the magnitude of the sense current being proportional to the total resistance of the two series-connected MTJ cells. Different $\Delta R$ values of the two MTJs cells can also be achieved by fabricating the cells with different tunnel barrier thicknesses. This is readily achievable because the resistance-area product (RA) for magnetic tunnel junctions can be made to span 2-3 orders of magnitude for a given barrier material. For example, while the typical MTJ cell for an MRAM has a RA of approximately 1 k$\Omega\mu m^2$ the typical MTJ for a magnetoresistive sensor for recording head applications has RA well below 5 $\Omega m^2$. The advantage of making the cells have different $\Delta R$ values by varying the tunnel barrier thickness is that the magnetic properties of the SAF free layers for the two MTJ cells can still be made nearly the same.

While the invention has been described wherein the multibit memory stack has a single pair of toggle cells with opposite easy-axis-biasing, the invention is applicable to N stacked pairs, where N is 2 or more. Each of the N pairs in the stack has a uniquely aligned uniaxial anisotropy axis (the easy axis) for its two SAF free layers. Preferably the anisotropy axes of the N pairs are equally angularly spaced apart by approximately $2\theta$, where $2\theta=180/N$ and $\theta$ is also the half-angle between the anisotropy axes. If the anisotropy axes are not equally angularly spaced, the angle $\theta$ is chosen to be less than or equal to $\beta/2$, where $\beta$ represents the minimum angular separation of the anisotropy axes in the pairs in a multibit memory stack. To minimize the half-select cell disturbance, none of the easy axes are aligned perpendicularly to the write lines, i.e., the X and Y axes in the typical cross point MRAM architecture. The optimum case is achieved when the anisotropy axis closest to the +X axis is at +$\theta$ degrees.

Figure 9:
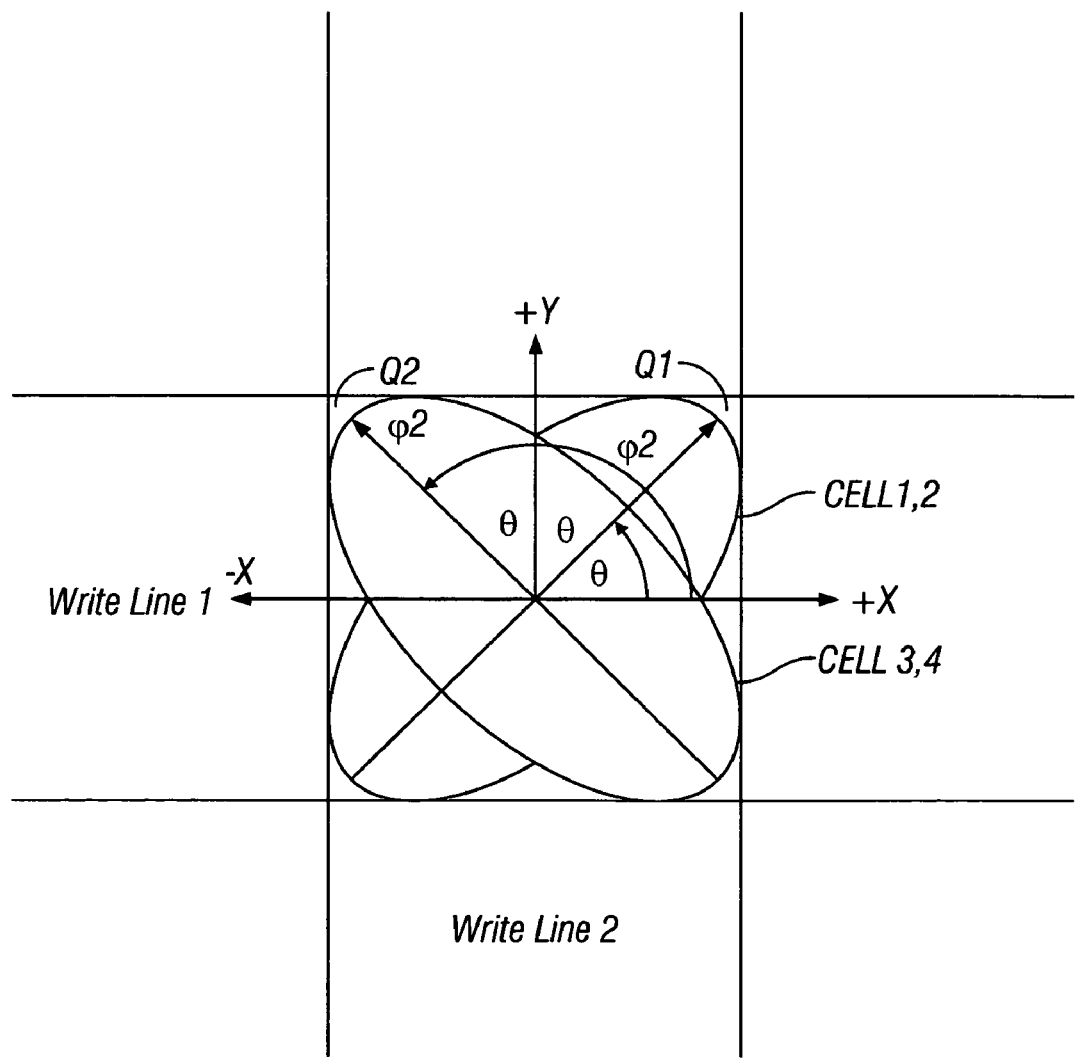
FIG. 9 is a top view of a multibit memory stack having two pairs of cells, with one pair having their easy axes aligned at 45 degrees to the +X and +Y axes and the other pair stacked on top of the first pair and having their easy axes aligned at 45 degrees to the −X and +Y axes.

FIG. 9 is a top view of a multibit memory stack having two (N=2) pairs of cells, with cells 3 and 4 located above cells 1 and 2 and having their easy axes aligned in the (-1, 1) direction (at 45 degrees to the -X and +Y axes in the second quadrant Q2). A nonmagnetic separation layer is formed above cell 1 before deposition of the layers making up cells 3 and 4. A chemical-mechanical polishing (CMP) process can be performed on the separation layer before fabrication of cells 3 and 4. The process for fabricating cells 3 and 4 on top of the separation layer is essentially the same as descried for cells 1 and 2 except that the deposition occurs in a magnetic field aligned with the easy axes of cells 3 and 4.

Figure 10:
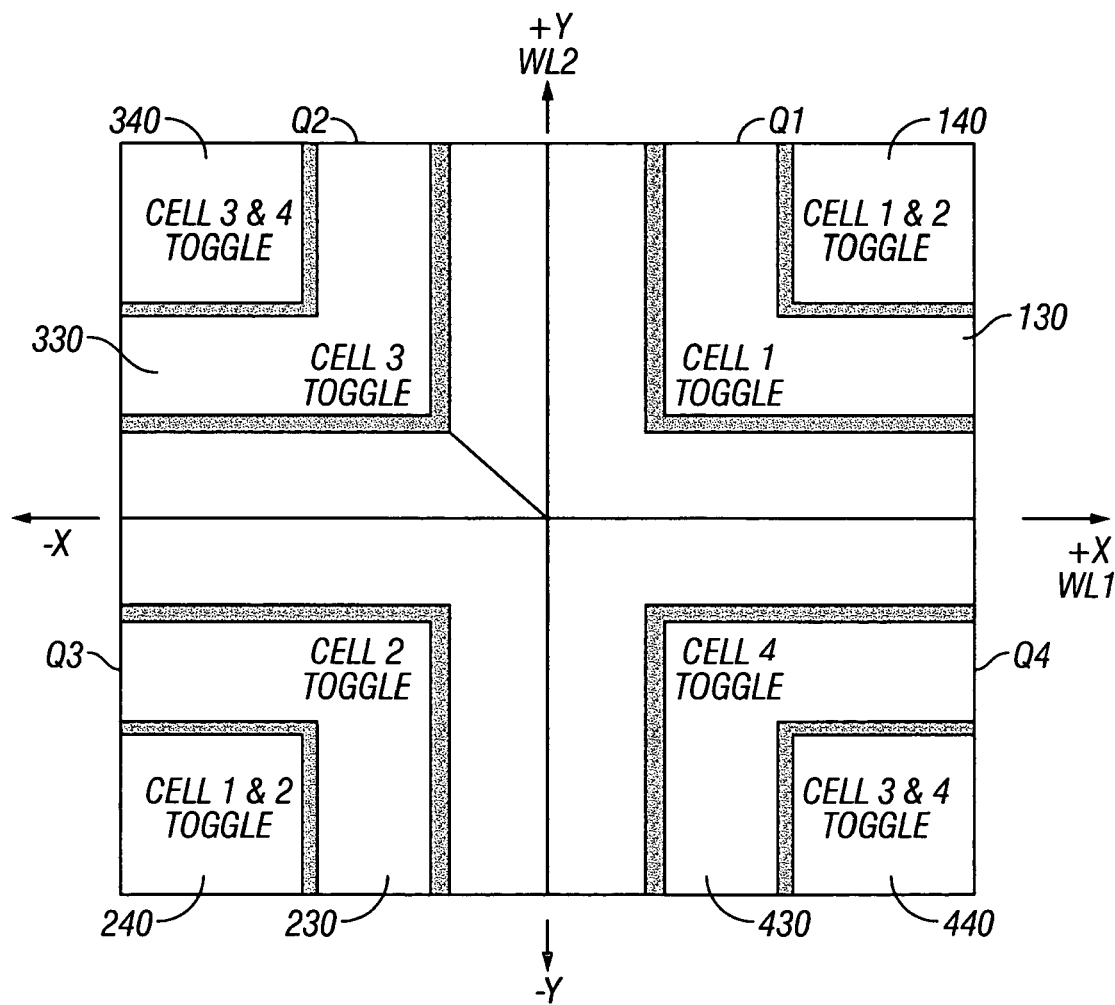
FIG. 10 shows the corresponding write current window for the four cells in the two pairs of toggle cells with opposite easy-axis-biasing depicted in FIG. 9.
Figure 10:
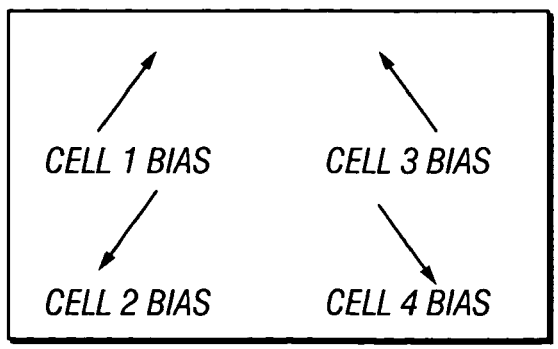

FIG. 10 shows the corresponding write current window for the two pairs of toggle cells with opposite easy-axis-biasing. Thus write currents $-I_{WL1}$ and $+I_{WL2}$ of sufficient magnitude to generate $H_W$ in the region 330 of Q2, and applied according to the toggle-write pulse sequence as described for FIG. 4, will toggle-write cell 3 but not cell 4. Similarly, write currents $+I_{WL1}$ and $-I_{WL2}$ of sufficient magnitude to generate $H_W$ in the region 430 of Q4, and applied according to the toggle-write pulse sequence as described for FIG. 4, will toggle-write cell 4 but not cell 3. Region 340 in Q2 and 440 in Q4 represent the regions of write fields where both cells 3 and 4 would be toggle written if the write currents were high enough to generate a write field greater than $(H_{SW}+H_B)$.

Figure 11:
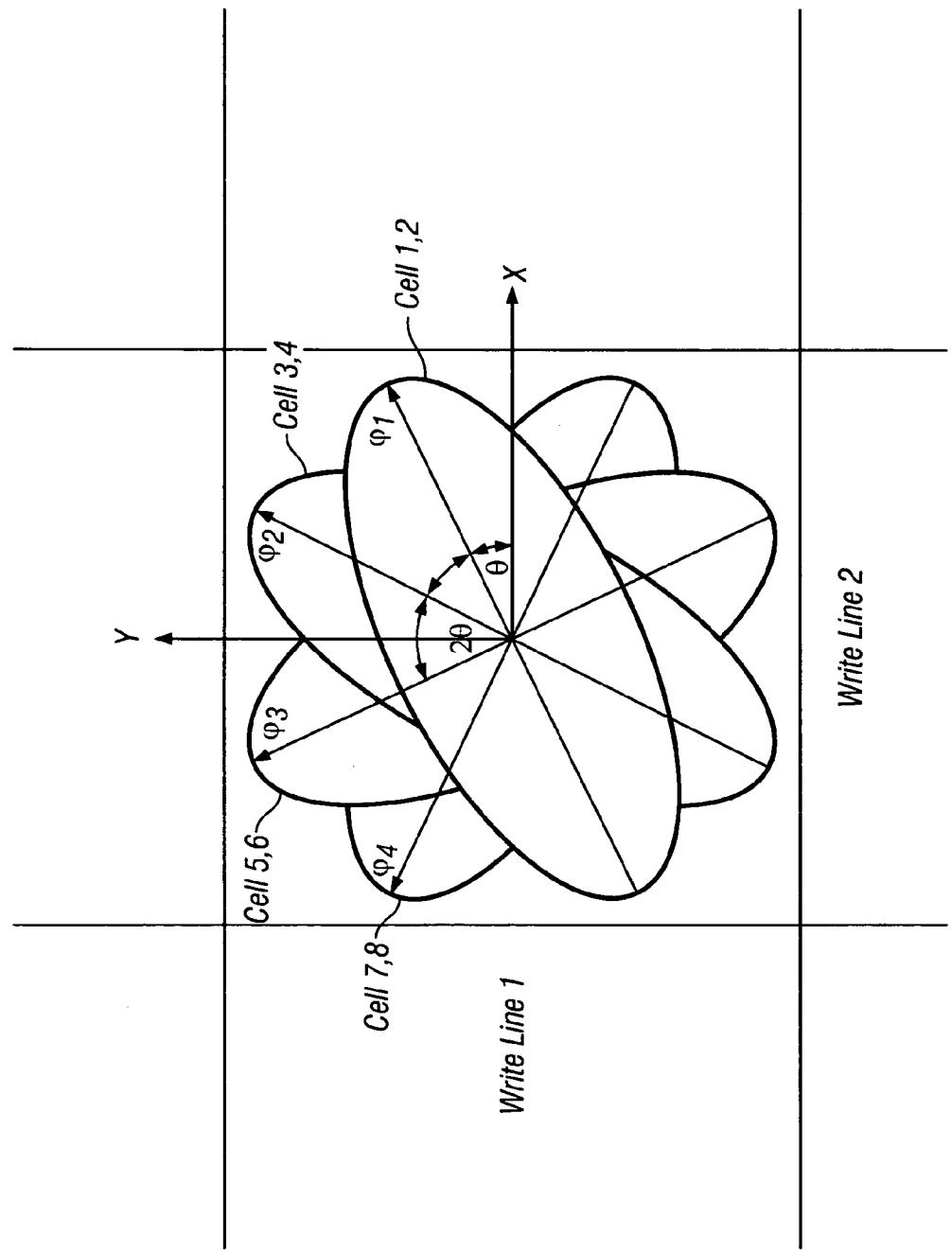
FIG. 11 is a top view of a multibit memory stack having four (N=4) pairs of cells, with the easy axes of the first pair aligned at an angle θ from the +X axis, and the easy axes of the N pairs equally angularly spaced by 2θ, where 2θ=180/N.

FIG. 11 is a top view of a multibit memory stack having four (N=4) pairs of cells. The easy axes of the first pair are aligned at an angle $\theta$ from the +X axis, and the easy axes of the N pairs are equally angularly spaced by $2\theta$, where $2\theta=180/N$. For N=4, the easy axis $\phi_j$ (j=1 to 4) for each pair of cells is evenly separated by 45 degrees apart ($\theta=22.5$ degrees) from the easy axes of the other pair of cells. Within the pair, the two cells are oppositely biased with field of $H_B$ along the corresponding anisotropy axis.

Selective writing of an individual selected cell in the N-pair cell stack is achieved by generating a write field in three pre-set directions using the two write lines. Each of the three current magnitudes ($I_k$, where k=1, 2 and 3) is high enough to generate a field sufficient to rotate the SAF free layer magnetization in a nearly perpendicular direction to the applied field, i.e., the spin-flop mode. During phase $t_1$, the applied field is set in the $(\phi_j-\theta)$ direction, or at an angle $-\theta$(cw) from the easy axis ($\phi_j$ of the selected cell (cell j). During phase $t_2$, the field is set parallel to the easy axis $\phi_j$. Finally, during phase $t_3$, the field is set in the $(\phi_j+\theta)$ direction, or at an angle $+\theta$(ccw) from the selected easy axis $\phi_j$. The relative pre-set current magnitudes at the $t_1$, $t_2$ and $t_3$ phases in write line 2 (field $H_X$) and write line 1 (field $H_Y$) respectively are as follows:

[$I_1 \cos(\phi_j-\theta), I_1 \sin(\phi_j-\theta)$]

[$I_2 \cos(\phi_j), I_2 \sin(\phi_j)$]

[$T_3 \cos(\phi_j+\theta), I_3 \sin(\phi_j+\theta)$]

During the write pulses the selected cell's free layer magnetization will rotate ccw during the write phases $t_1$, $t_2$ and $t_3$ by angles of approximately (90-$\theta$), $\theta$ and $\theta$ respectively, resulting in a net ccw rotation of (90+$\theta$) degrees. At the end of the write pulses, the magnetization direction of the selected cell will have rotated past its hard-axis by approximately $\theta$ degrees and will continue to rotate to the easy-axis direction, 180 degrees from its initial direction. For each of the other cells in the multibit memory stack, since its free layer magnetization direction never rotates closer to its hard-axis by an angle $\theta$, its magnetization direction returns to its initial magnetization direction and its magnetic state is not switched. So the selectivity of the writing among the N-pair cell stack can be achieved with three phases of current pulsing through the write lines. For a write field $H_W$, such that $(H_{SW}-H_B)<H_W<(H_{SW}+H_B)$, selected writing on the particular cell of the pair is achieved by selecting the polarity of the current applied.

Figure 12:
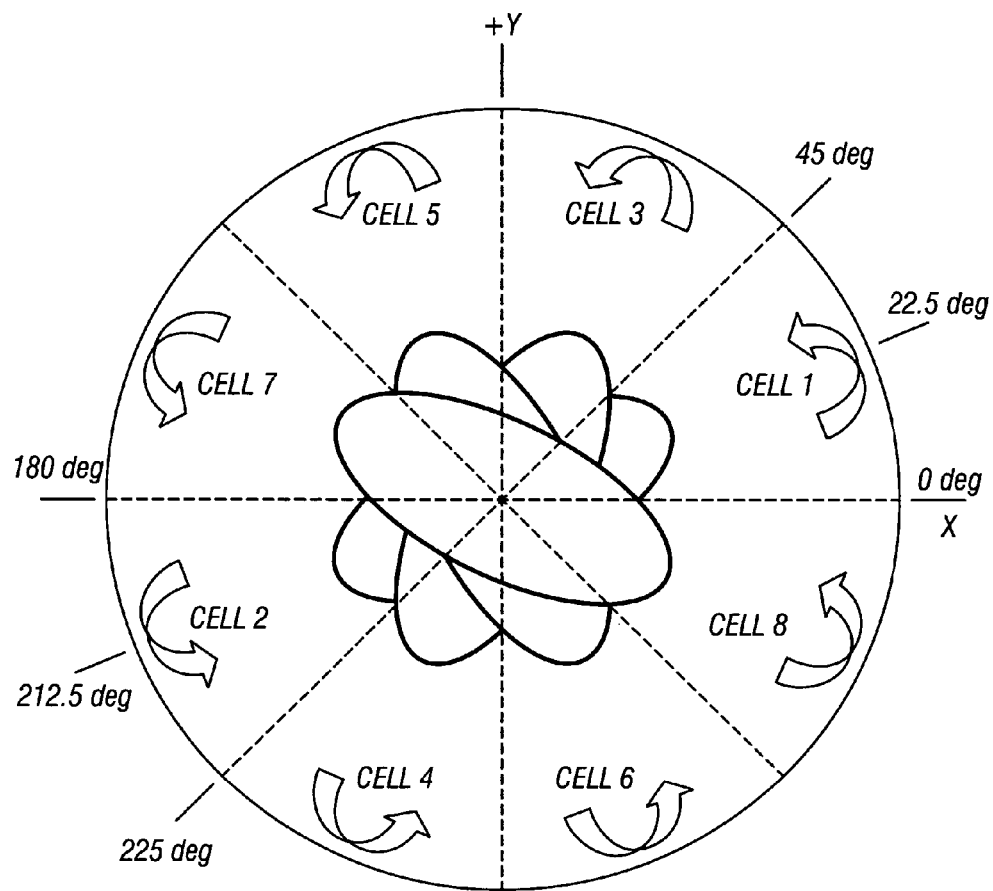
FIG. 12 is a schematic 8-part diagram for the selective toggle switching of the 8 individual cells in the multibit memory stack shown in FIG. 11 with 4 pairs of cells.

FIG. 12 is a schematic 8-part diagram for the selective toggle switching of the 8 individual cells in the multibit memory stack shown in FIG. 11 with 4 pairs of cells. Selective writing of cell 1, for example, is achieved with three phases of currents to successively generate write fields in the 0, 22.5 and 45 degree directions. Similarly, selective writing of cell 2, for example, is achieved with three phases of currents to generate write fields in the 180, 212.5 and 225 degree directions. Toggle writing to each of the 8 cells is indicated by the arrows. For toggle writing described in the prior art for a Savtchenko type MRAM that has only a single memory cell in each intersection region, write current of only a single polarity, and a single magnitude is sufficient for each write line. In the MRAM according to the present invention, that has a multibit memory stack of a single pair of stacked memory cells in each intersection region, the write circuitry must be able to provide bidirectional current on both of the write lines. When there are four stacked memory cells or two pairs (N=2) then to achieve selective writing of each of the four cells in the stack, the write circuitry must be able to provide bidirectional current with three levels of current magnitude on each write line. However, in the multibit MRAM of the present invention, the switching field for each cell has been reduced by $H_B$, allowing less write current and resulting in a lower-power toggling MRAM.

Selective reading of a selected cell in the multibit memory stack can be accomplished by measuring the resistance across the stack of cells, selectively write toggling the selected cell to be read (as described above), measuring the resistance across the stack of cells, and then writing the selected cell back to its original state. The increase or decrease in the two measured resistances indicates the state of the selected cell. Published patent application US20040125649A1 describes a method for reading a selected cell in a single-memory-layer toggling MRAM that has each cell associated with its own write lines but multiple cells in the single layer connected in series to a single transistor. The reading of the selected cell occurs by measuring the resistance of the series-connected cells before and after toggle writing the selected cell.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:

a substrate;

a plurality of first and second electrically conductive lines on the substrate, the second lines being located between the substrate and the first lines with the first lines overlapping the second lines and spaced from the second lines in a generally perpendicular direction from the substrate to define a plurality of intersection regions, the first line and second line at each intersection region being generally orthogonal; and a plurality of memory stacks, each memory stack located in an intersection region and comprising (a) a first memory cell having a pinned ferromagnetic layer, a synthetic antiferromagnetic (SAF) free layer with an in-plane easy axis of magnetization aligned nonparallel with both the first and second lines, and a nonmagnetic coupling layer between the pinned and free layers, the free layer of the first cell being biased by a first magnetic bias field parallel to its easy axis of magnetization, (b) a second memory cell having a pinned ferromagnetic layer, a synthetic antiferromagnetic (SAF) free layer with an in-plane easy axis of magnetization aligned parallel with the easy axis of magnetization of the free layer of the first cell, and a nonmagnetic coupling layer between the pinned and free layers, the free layer of the second cell being biased by a second magnetic bias field parallel to its easy axis of magnetization and substantially antiparallel to the first bias field, and (c) a nonmagnetic separation layer between said two memory cells; wherein the free layer of the first memory cell and the free layer of the second memory cell have substantially the same magnitude of net magnetic moment, and the first and second magnetic bias fields have substantially the same magnitude.

2. The MRAM of claim 1 wherein the first magnetic bias field is applied by the net magnetic moment of the pinned layer of the first cell and the second magnetic bias field is applied by the net magnetic moment of the pinned layer of the second cell.

3. The MRAM of claim 2 wherein each of the pinned layers in the first and second cells is an uncompensated SAF pinned layer.

4. The MRAM of claim 1 wherein the substrate is parallel to the X-Y plane of an X-Y-Z coordinate system and a direction perpendicular to the substrate is parallel to the Z axis, wherein the first lines are mutually parallel and parallel to the X axis, the second lines are mutually parallel and parallel to the Y axis, and the memory cells in each memory stack are stacked parallel to the Z axis.

5. The MRAM of claim 1 wherein each memory cell has an electrical resistance difference $\Delta R$ between the parallel and antiparallel alignment of its free and pinned layer magnetization directions, and wherein the $\Delta R$ of the first memory cell is substantially different from the $\Delta R$ of the second memory cell.

6. The MRAM of claim 5 wherein each memory cell is a magnetic tunnel junction (MTJ) cell and each nonmagnetic coupling layer is a tunnel barrier, and wherein the tunnel barrier thickness of the first MTJ cell is substantially different from the tunnel barrier thickness of the second MTJ cell.

7. The MRAM of claim 1 wherein each of the memory cells is a magnetic tunnel junction (MTJ) cell and wherein each nonmagnetic coupling layer is a tunnel barrier.

8. The MRAM of claim 1 wherein the easy axes of magnetization of the free layers of the first and second cells in each memory stack are aligned at approximately 45 degrees to the first and second lines.

9. The MRAM of claim 1 wherein the easy axis of magnetization of the SAF free layer in each cell is the axis of anisotropy induced by the shape of the cell.

10. The MRAM of claim 1 wherein the easy axis of magnetization of the SAF free layer in each cell is the axis of anisotropy induced during deposition of the SAF free layer, and wherein the first and second cells have the same shape and matching perimeters.

11. The MRAM of claim 10 wherein the memory cells have a circular shape.

12. The MRAM of claim 1 further comprising a plurality of transistors between the substrate and the second lines, and wherein each memory stack is electrically connected to a transistor.

13. The MRAM of claim 12 further comprising circuitry coupled to the transistors for detecting the electrical resistance across the memory stacks.

14. The MRAM of claim 1 further comprising write circuitry for directing electrical current to the first and second lines.

15. The MRAM of claim 14 wherein the write circuitry provides bidirectional current on the first and second lines in an intersection region.

16. The MRAM of claim 15 wherein the write circuitry is capable of providing three levels of current magnitude on each of the first and second lines.

17. The MRAM of claim 1 wherein each of the first lines comprises a pair of lines spaced on opposite sides of the memory stack.

18. The MRAM of claim 1 wherein each of the second lines comprises a pair of lines spaced on opposite sides of the memory stack.

19. A magnetic random access memory (MRAM) comprising:
  a substrate parallel to an X-Y plane of an X-Y-Z coordinate system;
  a plurality of memory stacks on the substrate and aligned parallel to the Z axis, each memory stack comprising (a) a first magnetic tunnel junction (MTJ) memory cell having a synthetic antiferromagnetic (SAF) free layer with an easy axis of magnetization aligned in an X-Y plane at an angle to the X and Y axes, an uncompensated SAF pinned ferromagnetic layer providing a magnetic biasing field to the free layer of the first cell in a direction substantially parallel to the easy axis of the free layer of the first cell, and a tunnel barrier between the pinned and free layers of the first cell, (b) a second MTJ memory cell having a synthetic antiferromagnetic (SAF) free layer with an easy axis of magnetization aligned substantially parallel to the easy axis of magnetization of the free layer of the first cell, an uncompensated SAF pinned ferromagnetic layer providing a magnetic biasing field to the free layer of the second cell in a direction substantially parallel to the easy axis of the free layer of the second cell and substantially antiparallel to the biasing field from the pinned layer of the first cell, and a tunnel barrier between the pinned and free layers of the second cell, and (c) a nonmagnetic separation layer between said two memory cells; wherein the free layers in the first and second memory cells have substantially the same magnitude of magnetization-direction switching field $H_{sw}$ in the absence of a magnetic bias field, and the pinned ferromagnetic layers in the first and second memory cells provide substantially the same magnitude of magnetic biasing field $H_B$;
  a plurality of first electrically conductive write lines parallel to the X axis;
  a plurality of second electrically conductive write lines parallel to the Y axis; and
  write circuitry coupled to the first and second write lines for directing electrical current to the first and second write lines to generate write fields to switch the magnetization directions of the free layers in the first and second memory cells.

20. The MRAM of claim 19 wherein the substantially parallel easy axes of magnetization of the free layers of the first and second cells in each memory stack are aligned approximately at 45 degrees to the X and Y axes.

21. The MRAM of claim 19 wherein the easy axis of magnetization of the SAF free layer in each cell is the axis of anisotropy induced by the shape of the cell.

22. The MRAM of claim 21 wherein each cell has a generally elliptical shape with the axis of anisotropy being aligned with the long elliptical axis.

23. The MRAM of claim 19 wherein each memory cell has an electrical resistance difference $\Delta R$ between the parallel and antiparallel alignment of its free and pinned layer magnetization directions, and wherein the $\Delta R$ of the first memory cell is substantially different from the $\Delta R$ of the second memory cell.

24. The MRAM of claim 19 further comprising a plurality of transistors on the substrate, and wherein each memory stack is electrically connected to a transistor, and read circuitry coupled to the transistors for detecting the electrical resistance across the memory stacks.

25. The MRAM of claim 19 wherein the write circuitry provides bidirectional current on the first and second write lines.

26. The MRAM of claim 19 wherein the write circuitry is capable of providing three levels of current magnitude on each of the first and second write lines.

* * * * *